(12) United States Patent
Pawloski et al.

(10) Patent No.: US 7,741,012 B1
(45) Date of Patent: Jun. 22, 2010

(54) METHOD FOR REMOVAL OF IMMERSION LITHOGRAPHY MEDIUM IN IMMERSION LITHOGRAPHY PROCESSES

(75) Inventors: Adam R. Pawloski, San Jose, CA (US); Amr Y. Abdo, Madison, WI (US); Gilles R. Amblard, San Jose, CA (US); Bruno M. LaFontaine, Pleasanton, CA (US); Ivan Lalovic, San Francisco, CA (US); Harry J. Levinson, Saratoga, CA (US); Jeffrey A. Schefske, San Jose, CA (US); Cyrus E. Tabery, Santa Clara, CA (US); Frank Tsai, Saratoga, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 1641 days.

(21) Appl. No.: 10/790,457

(22) Filed: Mar. 1, 2004

(51) Int. Cl.
 *G03F 7/00* (2006.01)

(52) U.S. Cl. .......................... 430/311; 134/1

(58) Field of Classification Search ............... 430/311; 134/1
 See application file for complete search history.

(56) References Cited

U.S. PATENT DOCUMENTS

| | | | |
|---|---|---|---|
| 5,610,683 A | 3/1997 | Takahashi | 355/53 |
| 5,900,354 A | 5/1999 | Batchelder | 430/395 |
| 6,024,801 A * | 2/2000 | Wallace et al. | 134/1 |
| 6,602,349 B2 | 8/2003 | Chandra et al. | 134/19 |
| 6,612,317 B2 * | 9/2003 | Costantini et al. | 134/58 R |
| 7,029,832 B2 * | 4/2006 | Rolland et al. | 430/322 |
| 2002/0163629 A1 | 11/2002 | Switkes et al. | 355/53 |
| 2003/0064604 A1 | 4/2003 | Umeda | 438/745 |
| 2003/0123040 A1 | 7/2003 | Almogy | 355/69 |
| 2003/0174408 A1 | 9/2003 | Rostalski et al. | 359/642 |

FOREIGN PATENT DOCUMENTS

| | | |
|---|---|---|
| EP | 0 822 583 A2 | 4/1998 |
| EP | 0 829 312 B1 | 4/2003 |

OTHER PUBLICATIONS

Switkes et al.; "Immersion Lithography at 157nm", J. Vac. Sci. Technol. B 19(6), Nov./Dec. 2001; pp. 2353-2356.*

Switkes et al.; "Immersion Lithography at 157 nm"; J. Vac. Sci. Technol. B 19(6), Nov./Dec. 2001; pp. 2353-2356.

(Continued)

*Primary Examiner*—Kathleen Duda
*Assistant Examiner*—Caleen O Sullivan
(74) *Attorney, Agent, or Firm*—Farjami & Farjami LLP

(57) ABSTRACT

A process for fabricating a semiconductor device, including applying an immersion lithography medium to a surface of a semiconductor wafer; exposing a material on the surface of the semiconductor wafer to electromagnetic radiation having a selected wavelength; and applying supercritical carbon dioxide to the semiconductor wafer to remove the immersion lithography medium from the surface of the semiconductor wafer. In one embodiment, the process includes recovery of the immersion lithography medium.

20 Claims, 4 Drawing Sheets

OTHER PUBLICATIONS

Smith et al.; "Immersion Optical Lithography at 193 nm"; Rochester Institute of Technology; Future Fab Int'l, vol. 15 (Jul. 11, 2003).

Goldfarb et al.; "Aqueous-based Photoresist Drying Using Supercritical Carbon Dioxide to Prevent Pattern Collapse"; J. Vac. Sci. Technol. B 18(6), Nov./Dec. 2000; pp. 3313-3317.

Jincao et al.; "Prevention of Photoresist Pattern Collapse by Using Liquid Carbon Dioxide"; Ind. Eng. Chem. Res. 2001, 40, pp. 5858-5860.

Sundararajan et al.; "Supercritical $CO_2$ Processing for Submicron Imaging of Fluoropolymers"; Chem. Mater, 2000, 12, pp. 41-48.

* cited by examiner

US 7,741,012 B1

METHOD FOR REMOVAL OF IMMERSION LITHOGRAPHY MEDIUM IN IMMERSION LITHOGRAPHY PROCESSES

TECHNICAL FIELD

The present invention relates generally to the field of integrated circuit manufacture and, more particularly, to a method for removal of immersion lithography medium from semiconductor wafer surfaces in immersion lithography processes.

BACKGROUND

The formation of various integrated circuit (IC) structures on a wafer often relies on lithography processes, sometimes referred to as photolithography. For instance, patterns can be formed from a photoresist layer by passing light energy through a mask (or reticle) having an arrangement to image the desired pattern onto the photoresist layer. As a result, the pattern is transferred to the photoresist layer. In areas where the photoresist is sufficiently exposed and after a development cycle, portions of the photoresist material can become soluble such that it can be removed to selectively expose an underlying layer (e.g., a semiconductor layer, a metal or metal containing layer, a dielectric layer, etc.). Portions of the photoresist layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the photoresist layer is transferred to the underlying layer. Alternatively, the photoresist layer can be used to block dopant implantation into the protected portions of the underlying layer or to retard reaction of the protected portions of the underlying layer. Thereafter, the remaining portions of the photoresist layer can be stripped.

There is a pervasive trend in the art of IC fabrication to increase the density with which various structures are arranged. As a result, there is a corresponding need to increase the resolution capability of lithography systems. One promising alternative to conventional optical lithography is a next-generation lithography technique known as immersion lithography. In immersion lithography, an immersion lithography medium is placed between the final lens of the imaging system and a photosensitive material (e.g., a photoresist) on the surface of a nascent semiconductor device. The desired pattern of radiation is transmitted through the immersion lithography medium to the photosensitive material. The immersion lithography medium replaces an air (or other gas) gap that is conventionally present between the final lens of a conventional dry lithography imaging system and the wafer. When the immersion lithography medium has an index of refraction higher than 1 (the index of refraction of air), the numerical aperture of the imaging system can be effectively increased, thereby enhancing resolution of the lithography process.

However, attempts to implement immersion lithography have encountered a number of challenges. Accordingly, there exists a need in the art for improved immersion lithography processes.

SUMMARY OF THE INVENTION

The present invention addresses some of the challenges in implementing immersion lithography. For example, the immersion lithography medium needs to be removed from the semiconductor wafer with which it has been used. The removal process should not substantially deleteriously affect the semiconductor wafer or any of the materials used in its fabrication, such as the photoresist. The removal process is needed in order to avoid contamination by the immersion lithography medium of the semiconductor device and of other process apparatus and steps in the fabrication. In addition, there exists a need for methods of recycling the immersion lithography medium removed from the semiconductor wafer for the efficient recovery and reuse at an appropriate point in the fabrication process. This will enhance both the process and economics of fabrication of semiconductor devices. The present invention addresses these needs.

According to one embodiment, the invention relates to a process for fabricating a semiconductor device, including applying an immersion lithography medium to a surface of a semiconductor wafer; exposing a material on the surface of the semiconductor wafer to electromagnetic radiation having a selected wavelength; and applying supercritical carbon dioxide to the semiconductor wafer to remove the immersion lithography medium from the surface of the semiconductor wafer.

According to another embodiment, the invention relates to a process for fabricating a semiconductor device, including applying an immersion lithography medium to a surface of a semiconductor wafer; exposing a material on the surface of the semiconductor wafer to electromagnetic radiation having a wavelength of about 157 nm, the exposing comprising passing the radiation through the immersion lithography medium; and applying supercritical carbon dioxide to the semiconductor wafer to remove the immersion lithography medium from the surface of the semiconductor wafer.

According to yet another embodiment, the invention relates to a process for fabricating a semiconductor device, including applying an immersion lithography medium to a surface of a semiconductor wafer, wherein the immersion lithography medium is a liquid that is substantially non-reactive with the material forming the surface of the semiconductor wafer and is substantially transparent to the radiation; exposing a material on the surface of the semiconductor wafer to electromagnetic radiation having a wavelength of about 157 nm, the exposing comprising passing the radiation through the immersion lithography medium; applying supercritical carbon dioxide to the semiconductor wafer to remove the immersion lithography medium from the surface of the semiconductor wafer; and obtaining a mixture of the immersion lithography medium removed from the surface and carbon dioxide and recovering the immersion lithography medium from the mixture.

As a result of the method and apparatus of the present invention, an immersion lithography system may be operated without contamination of either the semiconductor wafer or subsequent processing steps by the immersion lithography medium, and the immersion lithography medium may be efficiently recovered for reuse or recycling.

BRIEF DESCRIPTION OF THE DRAWINGS

These and further features of the present invention will be apparent with reference to the following description and drawings, wherein.

Figure 1:
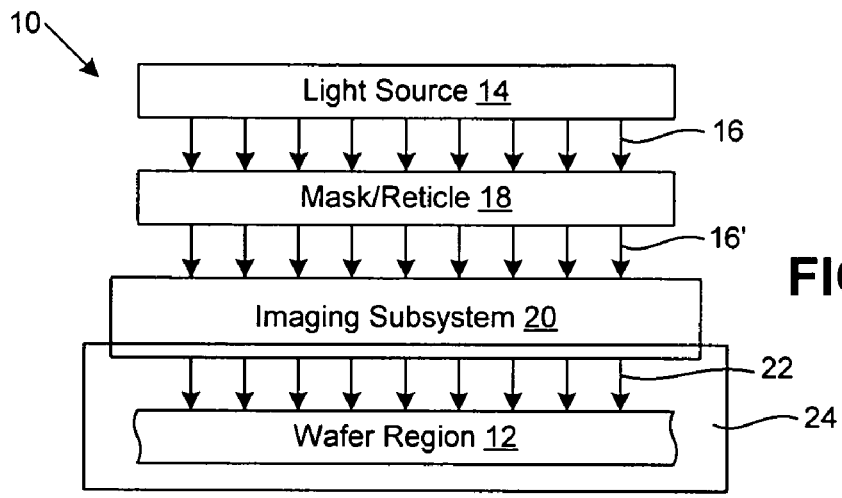
FIG. 1 is a schematic block diagram of an exemplary immersion lithography apparatus for integrated circuit processing.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

It should be appreciated that the process steps and structures described below do not form a complete process flow for manufacturing a semiconductor device. The present invention can be practiced in conjunction with semiconductor device fabrication techniques currently used in the art, and only so much of the commonly practiced process steps are included as are necessary for an understanding of the present invention.

The description herein is presented in the exemplary context of fabricating a wafer having a semiconductor device formed thereon. Example semiconductor devices include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electro-mechanical systems (MEMS) and so forth.

The methods described herein can provide for the efficient removal and, in one embodiment, for the efficient recovery for recycling and/or reuse, of immersion lithography medium used in immersion lithography, and of the carbon dioxide used to remove the immersion lithography medium.

Referring to FIG. 1, illustrated is a schematic block diagram of an exemplary semiconductor device processing arrangement that includes an immersion lithography system 10 used to image a pattern onto a wafer 12, or a region thereof. The system 10 can be, for example, a step-and-repeat exposure system or a step-and-scan exposure system, but is not limited to these example systems. The system 10 can include a light or other radiation source 14 for directing light or other radiation energy 16 towards a mask 18 (sometimes referred to as a reticle). The terms "light" and "radiation" are used interchangeably herein, and are intended to refer to electromagnetic radiation having a selected wavelength useful for immersion lithography. The light energy 16 can have, for example, a deep ultraviolet (DUV) wavelength (e.g., about 248 nm or about 193 nm) or a vacuum ultraviolet (VUV) wavelength (e.g., about 157 nm). In one embodiment, the selected wavelength is in a range from about 11 nm to about 400 nm. In one embodiment, the selected wavelength is about 157 nm.

The mask 18 selectively blocks light energy 16 such that a light energy pattern 16' defined by the mask 18 is transferred towards the wafer 12. An imaging subsystem 20, such as a stepper assembly or a scanner assembly, sequentially directs the energy pattern 16' transmitted by the mask 18 to a series of desired locations on a photoresist on the wafer 12. The imaging subsystem 20 may include a series of lenses and/or reflectors for use in scaling and directing the energy pattern 16' towards the wafer 12 in the form of an imaging (or exposure) light energy pattern 22.

The imaging pattern 22 (or exposure pattern) is transmitted by the imaging subsystem 20 through an immersion lithography fluid, or immersion lithography medium 24, that has a relatively high index of refraction (e.g., an index of refraction greater than 1). The immersion lithography medium 24 can be a liquid. In one example, highly purified de-ionized water can be used as the immersion lithography medium in conjunction with a 193 nm light source 14 (e.g., an argon fluorine (ArF) laser). In another example, polyfluoroethers can be used as the immersion lithography medium in conjunction with a 157 nm light source 14. In one embodiment, the immersion medium is a material which is substantially transparent to the wavelength of the light or electromagnetic radiation source used in the immersion lithography process.

As noted above, in one embodiment, the immersion medium is a polyfluoroether. In one embodiment, the polyfluoroether is available as a liquid, for example under the trade name FOMBLIN® from Ausimont S.p.A. Corp., Milan, Italy. Exemplary polyfluoroethers are disclosed in U.S. Patent Application Pub. No. US 2002/0163629, the disclosure of which is incorporated by reference herein for its teachings relating to polyfluoroethers for use as an immersion lithography medium.

In one embodiment, the immersion lithography medium is a liquid. In one embodiment, the immersion lithography medium has a high viscosity, and in another embodiment, the immersion lithography medium has a low viscosity. The low viscosity may be advantageous for immersion lithography in avoiding inclusion of bubbles. In one embodiment, the immersion lithography medium is substantially non-reactive with the material forming the surface of the semiconductor wafer and is substantially transparent to the radiation. In one embodiment, the immersion lithography medium is substantially free of optical defects. In one embodiment, the immersion lithography medium is substantially nontoxic. In one embodiment, the immersion lithography medium is substantially chemically inert, at least with respect to the material on the surface of the semiconductor wafer. Such material may be, for example, a photoresist, which may have chemical reactivity, so having an inert immersion lithography medium is helpful to avoid unwanted changes in the photoresist. Thus, in one embodiment, the material forming the surface of the semiconductor wafer is photosensitive to the selected wavelength.

Research is being carried out at present to develop additional immersion lithography media which meet the criteria needed for use in immersion lithography at wavelengths such as 157 nm. While water is suitable for use at 193 nm, it is not suitable for use at 157 nm, since it absorbs radiation at that wavelength. The refractive indices of the above-mentioned FOMBLIN® polyfluoroethers are believed to be about 1.34-1.37. A greater index of refraction would be desirable, since the index of refraction of many optical elements are greater than 1.4. Thus, the search goes on for new immersion lithography media. It is intended that the presently disclosed process is useful for removal of any immersion lithography medium which is susceptible to removal by the presently disclosed process, to with, by use of supercritical carbon dioxide. The immersion lithography medium, in one embodiment, has a refractive index greater than that of air, and in one embodiment, has a refractive index which is greater than air and less than or equal to that of the optics employed. In one embodiment, the immersion lithography medium is selected such that its refractive index differs from that of the optical elements by less than about 0.2 units, and in another embodiment, differs by less than 0.1 units.

Materials which may be suitable as the immersion lithography medium of the present invention are disclosed in International Publication No. WO 03/077034A2, entitled "Radiation Durable Organic Compounds with High Transparency in the Vacuum Ultraviolet, and Method for Preparing". The disclosure of WO 03/077034A2 is incorporated herein by reference for its teachings of such materials.

Figure 2:
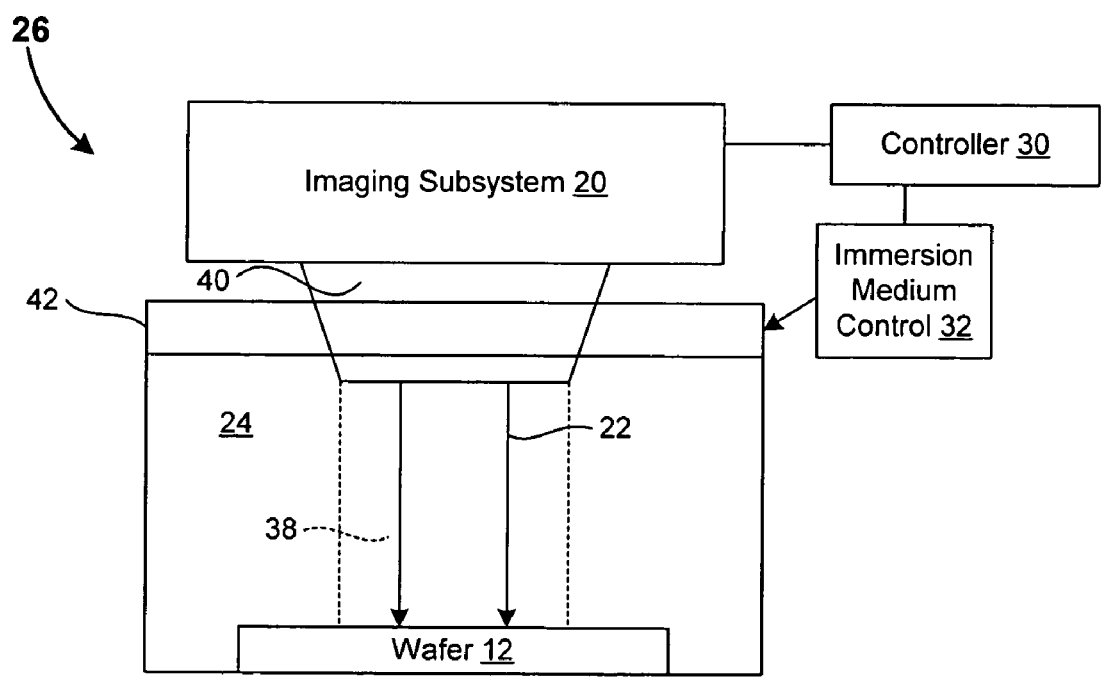
FIG. 2 is a schematic cross-sectional diagram of a portion of an exemplary immersion lithography apparatus for integrated circuit processing.

Referring next to FIG. 2, there is shown a schematic cross-sectional diagram of a portion of an exemplary immersion lithography apparatus for integrated circuit processing, in more detail. FIG. 2 shows a schematic block diagram of components of an immersion lithography system assembly 26 for use with the exemplary IC processing arrangement 10 of FIG. 1. The assembly 26 includes the imaging subsystem 20, a controller 30, an immersion medium control 32, and an immersion lithography medium 24 in a chamber 42. The imaging subsystem 20 includes a lens 40. As illustrated in FIG. 2, the lens 40 extends into the medium 24 in the chamber 42. A volume 38 of the immersion medium 24 which is traversed by the output from the imaging subsystem 20 is referred to herein as the traversal volume 38. In an embodiment in which the chamber 42 is relatively large, the traversal volume 38 forms only a part of the immersion medium 24.

In one embodiment, the immersion lithography medium 24 provides at least about 90% transmission of incident radiation through the medium to the material on the surface of the wafer 12, and in another embodiment, at least about 95% transmission, and in yet another embodiment, at least about 98% transmission. As used herein, "substantially transparent" means that the immersion lithography medium 24 provides at least about 80% transmission of incident radiation through the medium to the material on the surface of the wafer 12.

In one embodiment, the immersion medium 24 fills the space between the photo resist and the lens or optics in the imaging subsystem. In one embodiment, the space or gap between the photo resist and the optics, filled by the immersion medium, is from about 0.25 mm to about 5 mm, and in one embodiment from about 0.5 mm to about 2 mm across. In another embodiment, the traversal volume has a thickness or traversal length in the range from about 5 µm to about 250 µm, and in another embodiment, from about 10 µm to about 100 µm, and in one embodiment, about 50 µm. The thickness or traversal length is the distance from the surface of the semiconductor wafer 12 to the closest part of the imaging subsystem 40. For example, in FIG. 2, the thickness or traversal length is shown by the length of the arrow 22. Thus, in one embodiment, the traversal volume has a thickness or traversal length in these ranges.

In carrying out the immersion lithography process, first an immersion lithography medium is applied to a surface of a semiconductor wafer 12. In one embodiment, the wafer 12 may be immersed in the immersion lithography medium 24, and in another embodiment, the medium 24 is applied to the surface of the wafer 12 as the wafer and/or the imaging system moves stepwise in relation to each other. In operation of the system, radiation from the light source 14 passes selectively through the mask 18 and into the imaging subsystem 20. In the imaging subsystem, the radiation is focused by any combination of reflection and refraction, and emerges through the lens 40. The radiation emerges from the lens 40 into the immersion lithography medium 24, passes through the traversal volume 38 and interacts with the wafer 12. In one embodiment, the exposing includes passing the radiation through the immersion lithography medium. As a result, the wafer 12 is exposed to the radiation. In the interaction, the radiation causes chemical reaction(s) in the material, such as a photoresist, on the surface of the wafer 12.

After the wafer 12 is exposed to the radiation, the wafer may be moved to a new location, and/or the imaging subsystem 20 and/or other components of the apparatus are moved away from the wafer 12.

In the next step of the method of the present invention, the wafer 12 is treated with supercritical carbon dioxide to remove the immersion lithography medium 24.

Figure 3:
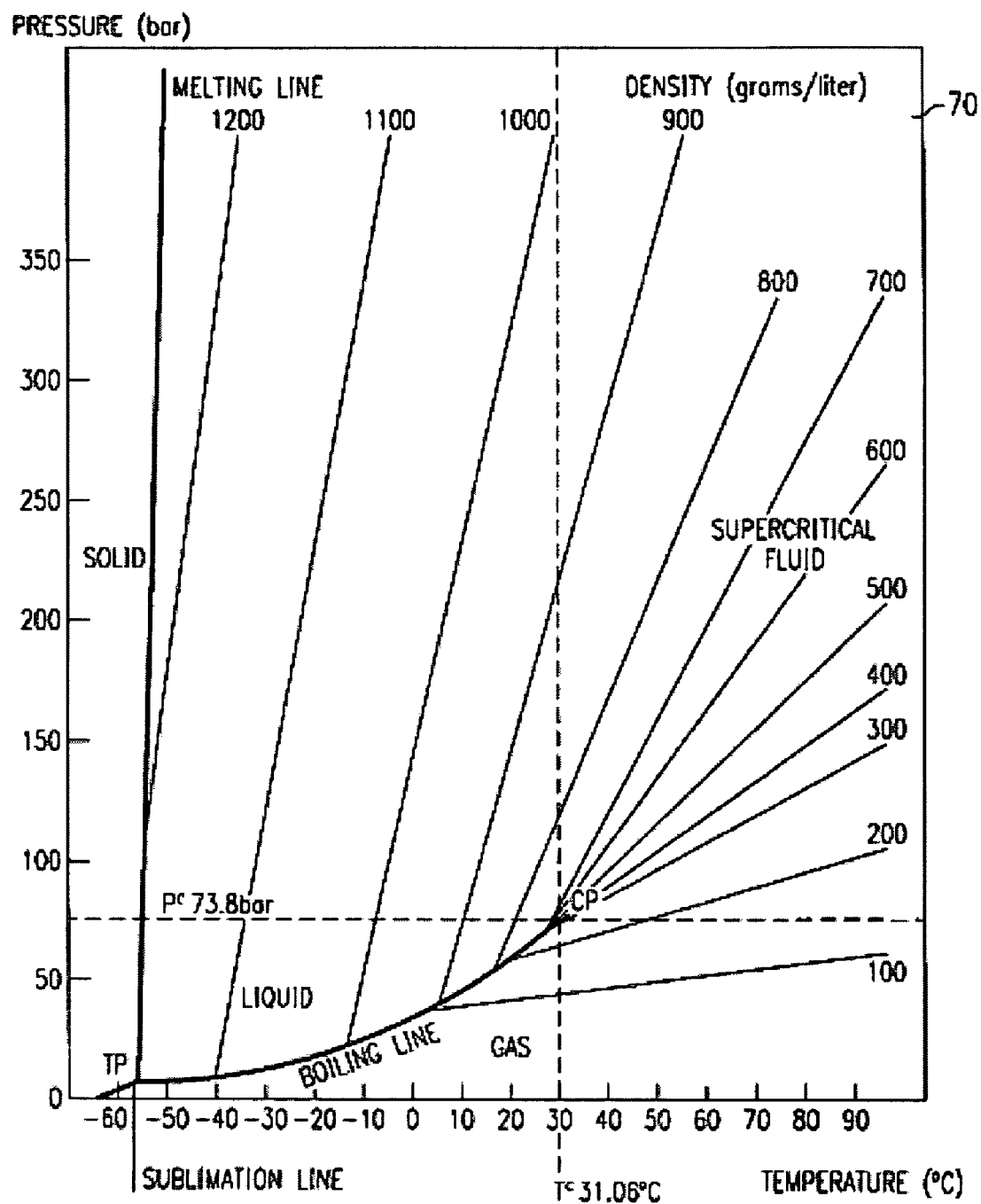
FIG. 3 is a diagram of temperature versus pressure for carbon dioxide.

FIG. 3 is a diagram of temperature versus pressure for carbon dioxide. Referring to FIG. 3, a pressure-temperature-density chart for carbon dioxide is illustrated, with the region generally shown at 70 illustrating when carbon dioxide is above the critical point (CP). As illustrated in FIG. 3, carbon dioxide needs to be maintained in a pressure environment above the critical pressure, $P^c$, 73.8 bar, and above the critical temperature, $T^c$, 31.06° C. for it to remain in its supercritical state. The density of the supercritical carbon dioxide will thus be above about 200 grams per liter. Below the critical point, at a temperature above and a pressure below the boiling line shown in FIG. 3, carbon dioxide exists as a gas, as long as the pressure is below $P^c$, 73.8 bar (for temperatures above $T^c$, 31.06° C.). At lower temperatures and/or pressures, the carbon dioxide may exist as a gas, a liquid or as a solid. As will be understood, by adjusting the temperature and pressure appropriately, the carbon dioxide can be converted to a gas and thereby easily separated from the immersion lithography medium, which in most embodiments is a liquid at many temperatures and pressures at which the carbon dioxide is a gas. For example, if the pressure is reduced with the temperature above $T^c$, the supercritical carbon dioxide will be converted directly to the gaseous state without formation of the liquid or solid form of the carbon dioxide.

Any apparatus known in the art for applying supercritical carbon dioxide to a solid substrate may be used in the present invention. A number of such systems are known. In general, such apparatus includes a pressurizable chamber, a source of carbon dioxide, a heat source and a pressurization source, and an exit port through which used supercritical carbon dioxide, mixed with the removed immersion lithography medium, can be removed from the apparatus in which the applying step is carried out.

In one embodiment, the apparatus may include a continuous flow, steady state supercritical carbon dioxide delivery and recovery system such as that disclosed in U.S. Pat. No. 6,612,317, or any of the many known systems. The disclosure of U.S. Pat. No. 6,612,317 relating to apparatus for delivery and recovery of supercritical carbon dioxide is incorporated herein by reference. The '317 patent discloses the use of cosolvents. In one embodiment of the present invention, no cosolvent is used. In one embodiment of the present invention no additives are used with the supercritical carbon dioxide. Many other supercritical carbon dioxide apparatuses are known in the art and may be suitably selected for use with the present invention, which is not limited to any particular apparatus.

In one embodiment, the process further comprises recovery of the immersion lithography medium. In this embodiment, following the step of applying supercritical carbon dioxide to the wafer, a mixture of the immersion lithography medium removed from the surface and carbon dioxide is obtained. The mixture can then be treated to recover the immersion lithography medium from the mixture. In one embodiment, recovering the medium includes reducing pressure and/or temperature of the mixture and removing carbon dioxide as a gas. As will be understood, when either or both of the temperature and pressure of the supercritical carbon dioxide is reduced sufficiently, the carbon dioxide is no longer in the supercritical state, and can revert to a gas, a liquid or a solid, depending on the new conditions. In perhaps the simplest embodiment, the temperature and pressure are reduced so that the carbon dioxide exists as a gas. Since it is then in its gaseous state, and if the immersion lithography medium is in a liquid or solid state, the carbon dioxide can thereby be separated easily from the recovered immersion lithography medium.

Figure 4:
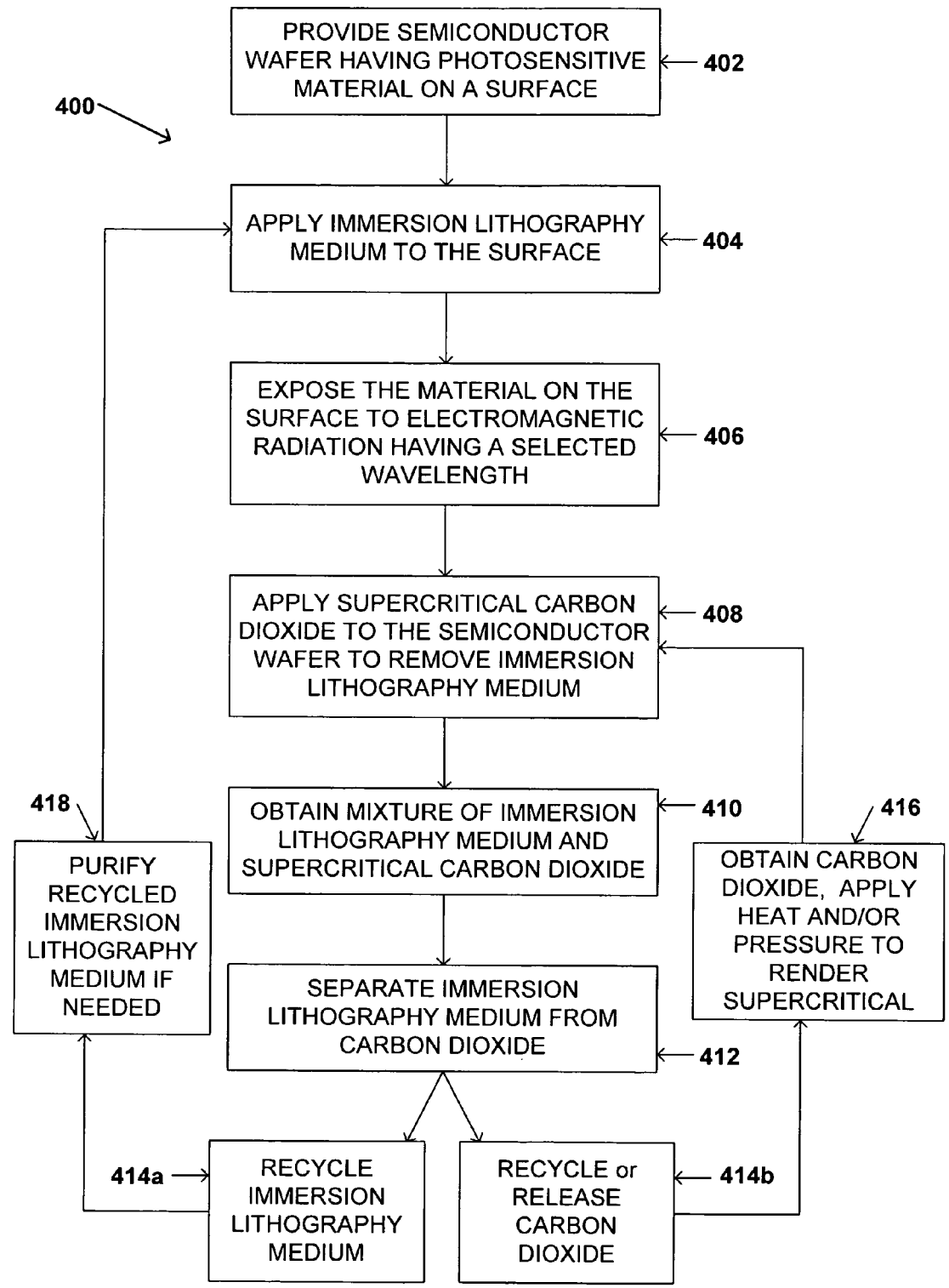
FIG. 4 is a process flow diagram depicting steps in accordance with an embodiment of the present invention.

FIG. 4 is a process flow diagram depicting steps in a process 400 in accordance with an embodiment of the present invention. As shown in FIG. 4, in a first step 402, a semiconductor wafer having a material on its surface is provided. In one embodiment, the material is a photosensitive material, such as a photoresist. In one embodiment, the material forming the surface of the semiconductor wafer is photosensitive to the wavelength of radiation which will be selected and to which the material on the surface of the wafer will be exposed in a subsequent step.

Next, as illustrated in FIG. 4, in a step 404, an immersion lithography medium is applied to the surface of the wafer. As disclosed above, the medium may be applied to the entirety of the wafer surface in a single application or may be applied to portions of the wafer surface in a stepwise manner, for example in conjunction with the movement of a stepper. The immersion lithography medium may be any of the materials disclosed above for this use. In one embodiment, the immersion lithography medium is substantially non-reactive with the material forming the surface of the semiconductor wafer. In one embodiment, the immersion lithography medium is substantially transparent to the radiation which will be applied in a subsequent step.

Next, a step 406 is carried out, in which the material on the surface of the wafer is exposed to electromagnetic radiation having a selected wavelength. In one embodiment, the selected wavelength is in a range from about 11 nm to about 400 nm. In another embodiment, the selected wavelength is about 157 nm. The present invention is not limited to any particular wavelength of radiation, although in the present commercial and technical environment it is perhaps most useful at about 157 nm. As known in the art, when the material on the surface of the wafer is photosensitive to the wavelength of radiation to which it is exposed, some chemical reaction will take place as a result of the exposure. Depending on the particular chemistry involved, the exposure may result in either increased or decreased lability and removability of the material.

Additional steps may be carried out at any point in the process, as needed. At this point in the process, such other steps may include, for example, removing the wafer from the apparatus in which it was exposed to the radiation in step 406, transferring the wafer to an apparatus in which a step of applying supercritical carbon dioxide is carried out, adjustment of the apparatus in which the radiation exposure was carried out to accommodate the conditions in which the step of applying supercritical carbon dioxide is carried out, etc. Such steps may be suitably determined by those of ordinary skill in the art.

Next, in accordance with the invention, as shown in FIG. 4, a step 408 is carried out, in which supercritical carbon dioxide is applied to the semiconductor wafer to remove the immersion lithography medium. This step may be carried out in a suitable apparatus, as known in the art. As presently known in the art, the apparatus should be suitable for withstanding the pressure and temperature of supercritical carbon dioxide. As shown in FIG. 3, the critical pressure, $P^c$, for supercritical carbon dioxide is 73.8 bar, equivalent to 75.255 kg/cm$^2$. Therefore, the apparatus should be able to withstand at least this much pressure, at a temperature of at least the critical temperature, $T^c$, 31.06° C. The supercritical carbon dioxide removes the immersion lithography medium.

One or more semiconductor wafers having the immersion lithography medium on a surface may be treated simultaneously with the supercritical carbon dioxide. In one embodiment, the apparatus for carrying out this step includes racks, trays or other suitable means for holding a plurality of the semiconductor wafers for treatment. In one embodiment, the apparatus for carrying out this step is equipped to carry out the step on a continuous and/or automated basis. In view of the very high pressures, it is desirable that this step be carried out with a minimum of human involvement. In one embodiment, the process is carried out from the step of exposing without direct human intervention.

Upon completion and as a result of the step 408, applying the supercritical carbon dioxide to remove the immersion lithography medium, in a step 410, a mixture of the immersion lithography medium and supercritical carbon dioxide is obtained. The mixture is removed from the one or more wafers to which the supercritical carbon dioxide has been applied, and may be removed from the apparatus by a suitable drain, vent or other exit port. In one embodiment, in removing the mixture, the pressure and/or temperature may be reduced to a point at which the carbon dioxide is no longer in a supercritical state. In one embodiment, the mixture is removed to a suitable holding container or apparatus, until such time as it is further processed.

At this point, in one embodiment of the present invention, the process is complete. However, for one or more of economic or environmental reasons, the components of the mixture may be further treated or processed.

In one embodiment, in a next step 412, the mixture of immersion lithography medium and carbon dioxide is treated to separate these components. As noted above, since the carbon dioxide can be converted to the gaseous state by simply reducing the pressure, this is a convenient method for removing the carbon dioxide. In one embodiment, the step of recovering includes reducing pressure and/or temperature of the mixture and removing carbon dioxide as a gas.

As shown in FIG. 4, in a step 414b, in one embodiment, the carbon dioxide is optionally recycled. If the recycle option in step 414b is carried out, the carbon dioxide will be treated by application of suitable heat and pressure to render the carbon dioxide supercritical again, as shown in step 416. In one embodiment, the carbon dioxide is re-purified in, between or as a part of step 414b and/or as part of step 416. Following the step 416, the supercritical carbon dioxide may be provided to the step 408, as shown in FIG. 4.

In another embodiment, also shown as an option in step 414b, the carbon dioxide is simply released to the atmosphere. If the carbon dioxide is obtained from an industrial process which generates carbon dioxide and would otherwise release the carbon dioxide to the atmosphere, there is no net increase in atmospheric carbon dioxide as a result of such release from the present process.

It may be more desirable for a number or reasons, of course, to continue to recycle the carbon dioxide. For example, in one embodiment, the pressure of the carbon dioxide may be reduced below the critical pressure, but the pressure can be maintained at an elevated pressure relative to atmospheric pressure. By maintaining the pressure at an elevated level, less work will be required to increase the pressure to at least the critical pressure when the carbon dioxide is recycled for re-use as supercritical carbon dioxide. Thus, as will be understood, it will likely be more efficient to recycle the carbon dioxide as shown in step 414b and step 416, for use in the present process, than to start with new carbon dioxide which is presumably at a lower temperature and/or pressure.

As shown in FIG. 4, in a step 414a, in one embodiment, the immersion lithography medium recovered from the mixture can be recycled to the step 404, and applied to another semiconductor wafer.

As shown in FIG. 4, in a step 418, in one embodiment, following removal of the carbon dioxide, the recycled immersion lithography medium may be suitably re-purified if needed, and any other components with which it is mixed removed from the medium. Following step 418, the medium may be recycled to the step 404, as described above.

Figure 5:
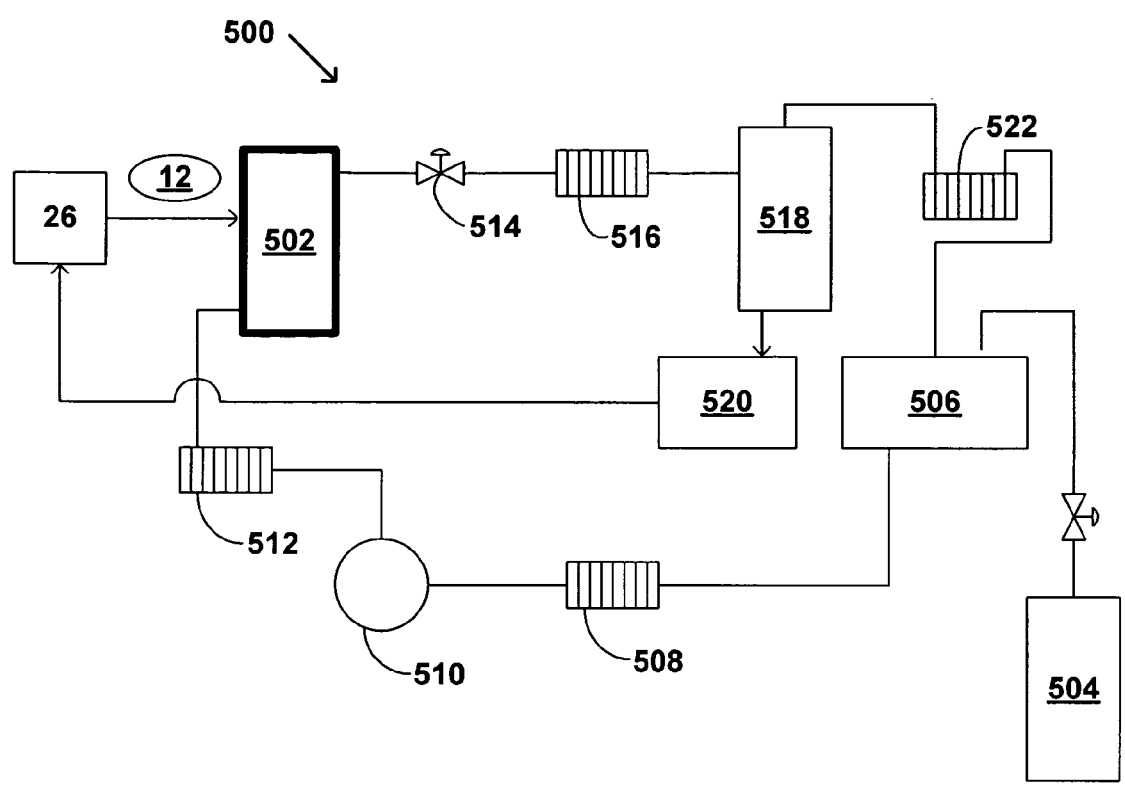
FIG. 5 is a process diagram of a system for carrying out an embodiment of the present invention.

FIG. 5 is a process diagram of a system 500 for carrying out an embodiment of the present invention. As shown in FIG. 5, a wafer 12, comprising a quantity of the immersion lithography medium is transferred from an immersion lithography system assembly 26 to a high pressure chamber 502 in which supercritical carbon dioxide will be applied to the wafer to remove the immersion lithography medium from the wafer 12. As noted above, a plurality of wafers 12 may be transferred to the high pressure chamber 502 and be treated simultaneously.

Referring to FIG. 5, the system 500 includes a carbon dioxide source 504, such as a cylinder of compressed carbon dioxide gas. Carbon dioxide gas from the source 504 is provided through appropriate valving to a receiving tank 506. In addition to carbon dioxide from the source 504, carbon dioxide recycled from the process may be also provided to the receiving tank 506.

Carbon dioxide from the receiving tank 506 is next routed through a first heat exchanger 508 to a high pressure compressor pump 510. The carbon dioxide is heated in the first heat exchanger 508 to an initial increased temperature and is then pressurized to or near the critical pressure, $P^c$, by the high pressure compressor pump 510. The high pressure compressor pump 510 can be any suitable pump known in the art capable of imparting the pressures necessary for rendering carbon dioxide into the supercritical state (in conjunction with the temperature).

Thereafter, the carbon dioxide may be further heated in a second heat exchanger 512 and then provided to the chamber 502. In some embodiments, the second heat exchanger 512 can be omitted, if sufficient heat is supplied by the first heat exchanger 508. Alternatively, the first heat exchanger 508 may be omitted, if sufficient heat is supplied by the second heat exchanger 512. In the second heat exchanger 512, the temperature of the carbon dioxide may be increased to or above the critical temperature, $T^c$, if this has not already been done by the first heat exchanger 508. As will be understood, by increasing the temperature at this point, the pressure will also be increased. Thus, at the point the carbon dioxide is provided to the chamber 502, it has been rendered supercritical. As described below and known in the art, the pressure of the supercritical carbon dioxide can be adjusted as needed for selected solvation effects. In one embodiment, the pump 510 is capable of generating selected pressures as needed for this purpose. The application of heat and/or pressure to render the carbon dioxide supercritical corresponds to the step 416 in FIG. 4.

In the chamber 502, the supercritical carbon dioxide is applied to the wafers 12 to be treated, to remove immersion lithography medium present on surfaces of the wafers 12. Suitable chambers are known in the art and have been used extensively for purposes such as extraction of selected factors from bulk materials. Examples of such extractions include caffeine from coffee beans and hops extract from hops used in brewing. This corresponds to the step 408 in FIG. 4.

As is known in the art, supercritical carbon dioxide exhibits a pressure-dependent dissolving power. In general, the higher the pressure of the supercritical carbon dioxide, the higher is the dissolving power. This property can be used in the present invention to optimize removal of the immersion lithography medium while avoiding adverse effects on the wafer and materials which have been previously formed or deposited thereon. Thus, by selection of the pressure of the supercritical carbon dioxide in the chamber 502, and depending on the nature of the immersion lithography medium, the process can be adjusted so that substantially only the immersion lithography medium is removed from the wafer 12, while leaving in place other elements, such as the photoresist or other materials on the wafer 12.

Referring still to FIG. 5, when the wafer(s) 12 in the chamber 502 have been treated by applying the supercritical carbon dioxide to the wafer surfaces, a mixture of the immersion lithography medium and the supercritical carbon dioxide is formed. This corresponds to the step 410 of FIG. 4. In one embodiment, the mixture contains substantially only carbon dioxide and the immersion lithography medium.

Referring to FIG. 5, the mixture exits the chamber 502 (as shown, from the upper end, but not necessarily at that location) through a line leading to a pressure reducing valve 514. as a result of the pressure reducing valve 514, the pressure inside the chamber is maintained, while the pressure of the mixture exiting the valve 514 is reduced. The mixture may then pass through a heat exchanger 516 and thence to a gas-liquid separator 518. The heat exchanger 516 can further reduce the temperature of the mixture and can recover some heat for use elsewhere in the process or elsewhere in the facility. In some embodiments, the heat exchanger 516 can be omitted. In the gas-liquid separator 518, since the pressure and/or the temperature of the mixture has been reduced, the carbon dioxide is no longer supercritical, and the mixture separates to yield the immersion lithography medium out of solution by the carbon dioxide and the carbon dioxide as a gas.

As shown in FIG. 5, in one embodiment, the immersion lithography medium can be withdrawn from the lower portion of the separator 518 into a vessel 520, from which it can be recycled to the immersion lithography system assembly 26. In one embodiment, the vessel 520 may include suitable apparatus to remove any impurities from and/or purify the immersion lithography medium, prior to its recycling to the assembly 26. The separation corresponds to the step 412, the recycling to the step 414a, and the purification corresponds to the step 418, shown in FIG. 4.

In one embodiment, the immersion lithography medium recovered from the mixture exhibits substantially the same chemical composition and/or substantially the same purity as the immersion lithography medium applied to a surface of the semiconductor wafer. In this embodiment, the immersion lithography medium withdrawn from the lower portion of the separator 518 into the vessel 520 can be directly recycled to the immersion lithography system assembly 26 without further re-purification. This feature, being able to reuse the immersion lithography medium directly without the need for re-purification, is one significant advantage conferred by use of supercritical carbon dioxide as described herein. In one embodiment, the feature of being able to reuse the immersion lithography medium directly without the need for re-purification is obtained by use of the dissolving power of supercritical carbon dioxide, which can be varied with the pressure of the supercritical carbon dioxide.

In one embodiment, by varying the pressure of the mixture of supercritical carbon dioxide and immersion lithography medium, impurities which may be present controllably can be caused to either precipitate from the mixture at a pressure higher than the pressure at which the immersion lithography medium separates from the mixture, or remain in solution in the supercritical carbon dioxide until after the immersion lithography medium has separated from the mixture. In one embodiment, by controlling and adjusting the pressure of the mixture, the immersion lithography medium can be obtained in substantially the same form, i.e., as substantially the same chemical composition and/or at substantially the same purity as the immersion lithography medium originally applied to the surface of the semiconductor wafer at the beginning of the process. By so doing, the same immersion lithography medium can be directly recycled many times without the necessity of either discarding or carrying out a possibly costly re-purification.

As shown in FIG. 5, carbon dioxide can be removed from the separator 518 at the top of the separator, although this is not required to be at the top. In one embodiment, the carbon dioxide removed from the separator 518 is passed through a fourth heat exchanger 522, and thence to the receiving tank 506. In another embodiment, not shown, the carbon dioxide removed from the separator 518 can be routed directly to the receiving tank 506, without first passing it through the fourth heat exchanger 522. In another embodiment, not shown, the carbon dioxide removed from the separator 518 can be routed directly to the first heat exchanger 508, or to the high pressure compressor pump 510, without first passing it through the fourth heat exchanger 522 and the receiving tank 506. In an embodiment in which the receiving tank 506 is omitted, fresh carbon dioxide may be provided to the process at any appropriate point from the source 504. The step of recycling the carbon dioxide corresponds to the step 414b in FIG. 4.

As described above, following the applying the supercritical carbon dioxide to the wafer to remove the immersion lithography medium, in one embodiment the process is complete.

Although particular embodiments of the invention have been described in detail, it is understood that the invention is not limited correspondingly in scope, but includes all changes, modifications and equivalents coming within the spirit and terms of the claims appended hereto.

INDUSTRIAL APPLICABILITY

The present invention relates generally to the field of integrated circuit manufacture and, more particularly, to a method and apparatus for removal of immersion medium from wafers treated in immersion lithography systems. The present invention provides a solution to problems including the removal and recovery of the immersion lithography medium of an immersion lithography system, thus advancing the art towards future generations of increased density with which various structures are arranged on semiconductor wafers. The present invention responds to the need to increase the resolution capability of lithography systems, to enable such increased densities. As a result of the method and apparatus of the present invention, an immersion lithography system may be operated efficiently without contamination of the wafer or subsequent process steps and apparatus by the immersion lithography medium.

What is claimed is:

1. A process for fabricating a semiconductor device, comprising:
    applying an immersion lithography medium to a surface of a semiconductor wafer;
    exposing a material on the surface of the semiconductor wafer to electromagnetic radiation having a selected wavelength;
    applying supercritical carbon dioxide to the semiconductor wafer to remove the immersion lithography medium from the surface of the semiconductor wafer; and
    following the step of applying supercritical carbon dioxide to the wafer, obtaining a mixture of the immersion lithography medium removed from the surface and carbon dioxide and recovering and purifying the immersion lithography medium from the mixture.

2. A process as in claim 1 wherein the immersion lithography medium is a fluoropolymer.

3. A process as in claim 1 wherein the immersion lithography medium is substantially non-reactive with the material forming the surface of the semiconductor wafer and is substantially transparent to the radiation.

4. A process as in claim 1 wherein the selected wavelength is in a range from about 11 nm to about 400 nm.

5. A process as in claim 1 wherein the selected wavelength is about 157 nm.

6. A process as in claim 1 wherein the material forming the surface of the semiconductor wafer is photosensitive to the selected wavelength.

7. A process as in claim 1, wherein recovering includes reducing pressure and/or temperature of the mixture and removing carbon dioxide from the mixture.

8. A process as in claim 1, wherein exposing comprises passing the radiation through the immersion lithography medium.

9. A process as in claim 1, wherein the immersion lithography medium recovered from the mixture and purified exhibits substantially the same chemical composition and/or substantially the same purity as the immersion lithography medium applied to a surface of the semiconductor wafer.

10. A process as in claim 1, wherein the immersion lithography medium recovered from the mixture and purified exhibits substantially the same purity as the immersion lithography medium applied to the surface of the semiconductor wafer, and the process further comprises recycling the recovered and purified immersion lithography medium for use in immersion lithography.

11. A process for fabricating a semiconductor device, comprising:
    applying an immersion lithography medium to a surface of a semiconductor wafer;
    exposing a material on the surface of the semiconductor wafer to electromagnetic radiation having a wavelength of about 157 nm, the exposing comprising passing the radiation through the immersion lithography medium;
    applying supercritical carbon dioxide to the semiconductor wafer to remove the immersion lithography medium from the surface of the semiconductor wafer; and
    following the step of applying supercritical carbon dioxide to the wafer, obtaining a mixture of the immersion lithography medium removed from the surface and carbon dioxide and recovering and purifying the immersion lithography medium from the mixture; and
    recycling the recovered and purified immersion lithography medium.

12. A process as in claim 11 wherein the immersion lithography medium is a fluoropolymer.

13. A process as in claim 11 wherein the immersion lithography medium is substantially non-reactive with the material forming the surface of the semiconductor wafer and is substantially transparent to the radiation.

14. A process as in claim 11 wherein the material forming the surface of the semiconductor wafer is photosensitive to the selected wavelength.

15. A process as in claim 11, wherein recovering includes reducing pressure and/or temperature of the mixture and removing carbon dioxide from the mixture.

16. A process for fabricating a semiconductor device, comprising:
   applying an immersion lithography medium to a surface of a semiconductor wafer, wherein the immersion lithography medium is substantially non-reactive with the material forming the surface of the semiconductor wafer and is substantially transparent to the radiation;
   exposing a material on the surface of the semiconductor wafer to electromagnetic radiation having a wavelength of about 157 nm, the exposing comprising passing the radiation through the immersion lithography medium;
   applying supercritical carbon dioxide to the semiconductor wafer to remove the immersion lithography medium from the surface of the semiconductor wafer; and
   obtaining a mixture of the immersion lithography medium removed from the surface and carbon dioxide and recovering and purifying the immersion lithography medium from the mixture.

17. A process as in claim 16 wherein the immersion lithography medium is a fluoropolymer.

18. A process as in claim 16 wherein the material forming the surface of the semiconductor wafer is photosensitive to the radiation.

19. A process as in claim 16, wherein recovering includes reducing pressure and/or temperature of the mixture and removing carbon dioxide from the mixture.

20. A process as in claim 16, wherein the immersion lithography medium recovered from the mixture exhibits substantially the same chemical composition and/or substantially the same purity as the immersion lithography medium applied to a surface of the semiconductor wafer.

* * * * *